United States Patent [19]

Decrulle

[11] 4,310,304
[45] Jan. 12, 1982

[54] INSTALLATION FOR ASSEMBLING ELECTRONIC COMPONENTS

[75] Inventor: André Decrulle, Paris, France

[73] Assignee: Compagnie Industrielle des Telecommunications Cit-Alcatel, Paris, France

[21] Appl. No.: 168,320

[22] Filed: Jul. 10, 1980

[30] Foreign Application Priority Data

Jul. 31, 1979 [FR] France .................. 79 19646

[51] Int. Cl.³ .................. F24J 3/00; F27B 9/22
[52] U.S. Cl. .................. 432/230; 432/59; 432/140
[58] Field of Search .................. 432/140, 59, 230; 228/180, 240, 255; 219/85 R, 85 BA, 85 BM, 388

[56] References Cited

U.S. PATENT DOCUMENTS 3,349,222 10/1967 Johnston .................. 432/59
3,517,164 6/1970 Huggins et al. .................. 219/388
3,583,063 6/1981 Growney .................. 29/471.1
4,118,178 10/1978 Calvi et al. .................. 432/59

*Primary Examiner*—John J. Camby
*Attorney, Agent, or Firm*—Kenyon & Kenyon

[57] ABSTRACT

An endless belt (1) transports supports (6) on which electronic components have been placed. The supports have a layer of solder which is to be melted to make electrical contact with the components assembled thereon. A hot plate (8) is arranged at the downstream end of the belt (1). In order to ensure uniform heating of the supports through the belt, the hot plate is provided with openings (10) in its plane, belt-contacting surface. The openings are connected to a vacuum pump (16) and the vacuum keeps the belt in intimate contact with the hot plate.

The installation is particularly intended for use in assembling hybrid micro-circuits, whether using thin film technology or thick film technology.

5 Claims, 4 Drawing Figures

INSTALLATION FOR ASSEMBLING ELECTRONIC COMPONENTS

The present invention relates to an installation for assembling electronic components on a support, and for soldering the components thereto by a re-melting process.

More precisely, the invention relates to an installation which comprises an endless conveyor belt moving horizontally past positions at which the components are assembled. Operators assemble the components onto supports, and then put the supports onto the belt. The supports are thus conveyed towards a position where heater elements cause a layer of solder previously deposited on the support to melt. Heating is provided by one or several hot plates, each comprising a plane surface over which the conveyor belt slides. Heat is principally conveyed to the belt by conduction. The belt transmits the heat received to the support, thereby causing the solder to re-melt.

When installations of the type just described are large, the conveyor belt may be several tens of meters long. It is then observed that, due to the uneven tensions round the length of the belt, contact between the belt and the hot plate is not adequate. This can result in large temperature differences between one point and another over the belt as it passes through the re-melting zone. This is a serious drawback since some supports may be poorly soldered while others may not even be soldered at all.

Preferred embodiments of the present invention mitigate this drawback.

The present invention provides an installation for assembling electronic components on a support and for soldering the components to the support by pre-melting a layer of metal previously deposited on the support, the installation comprising an endless conveyor belt on which the component-bearing supports are placed, the belt passing in contact with at least one hot plate having a plane surface over which the belt slides, wherein the hot plate is pierced by a plurality of ducts, each having one end opening out in the said plane surface and the other end connected to a vacuum pump.

The invention will be better understood from the following description of an embodiment thereof given by way of example with reference to the accompanying drawings in which.

Figure 1:
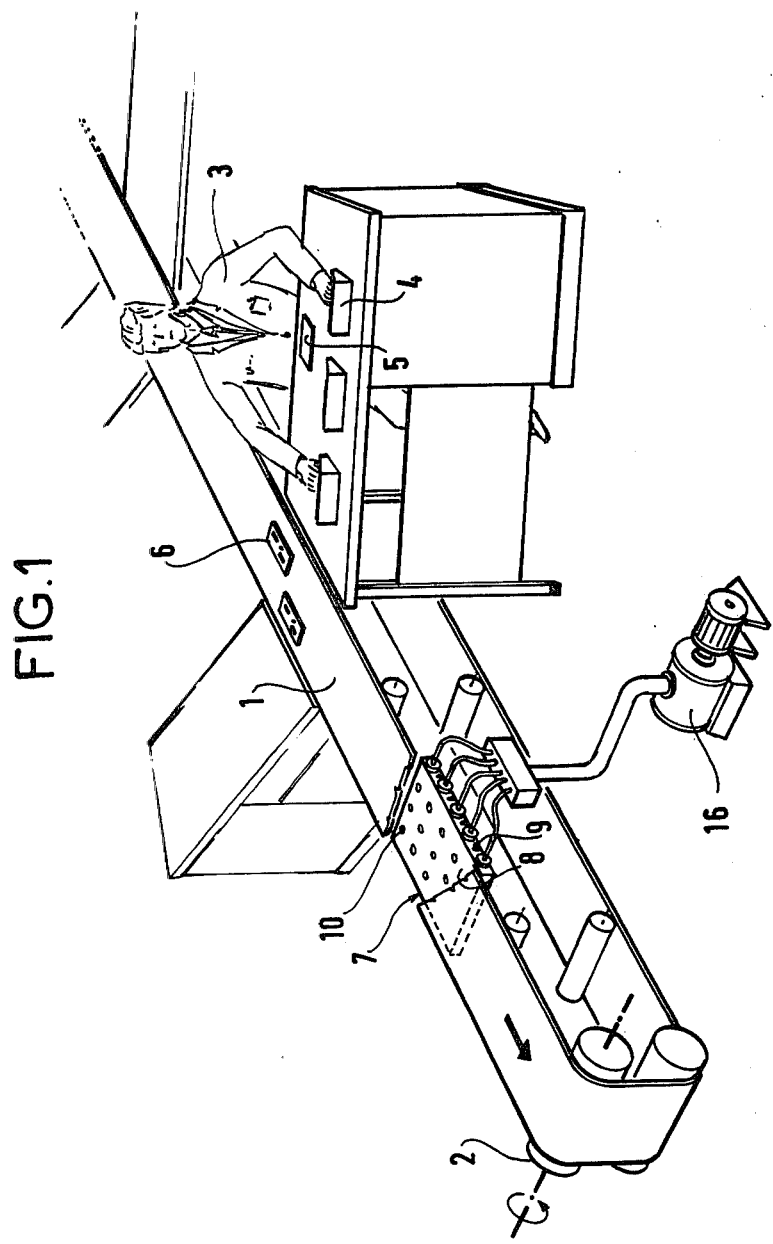
FIG. 1 is a general view of an installation in accordance with the invention.

In FIG. 1, reference 1 designates an endless conveyor belt stretched over rolls such as 2 with at least one of the rolls being provided with variable speed drive means (not shown) such as a motor.

Work positions are arranged on either side of the belt at which operators, such as 3, take electronic components from bins 4 and assemble them on supports 5.

These supports have a metal layer which, on re-melting, serves to solder the components onto the support.

Once assembly is completed, the operators place the component-bearing supports, now reference 6, on the conveyor belt.

The support is thus conveyed to the re-melting position. This position comprises a hot plate, such as 7, with a plane surface 8 in contact with the belt.

Heat produced by resistance elements 9 that are connected to a source of electricity (not shown) is transmitted by conduction to the conveyor belt. Advantageously the conveyor belt is made of a fibre glass based cloth impregnated with polyterephthalate ethyleneglycol charged with carbon.

The temperature may rise to about 200° C. and can be adjusted by varying the power supply to the resistance elements and/or varying the speed of the conveyor belt.

By virtue of the great length of the belt, and because of the unavoidable location of the re-melting position near to the point where the belt ends its forward journey and starts its return journey, it is observed that uneven tension exists in the belt where it passes through the re-melting position.

This causes contact between the belt 1 and the surface 8 to be imperfect, leading to temperature differences which can be large from one point to another on the belt. Differences of up to 40° C. have been observed at points where the belt loses contact with the hot plate by a distance of as little as one half of a millimeter. The supports which happen to be placed in such positions on the belt do not receive enough heat for proper re-melting.

To mitigate this drawback, the present invention provides the hot plate with ducts each ducts having one end 10 opening out in the surface 8 and having its other end (not shown in FIG. 1) connected to a vacuum pump 16.

Figure 2:
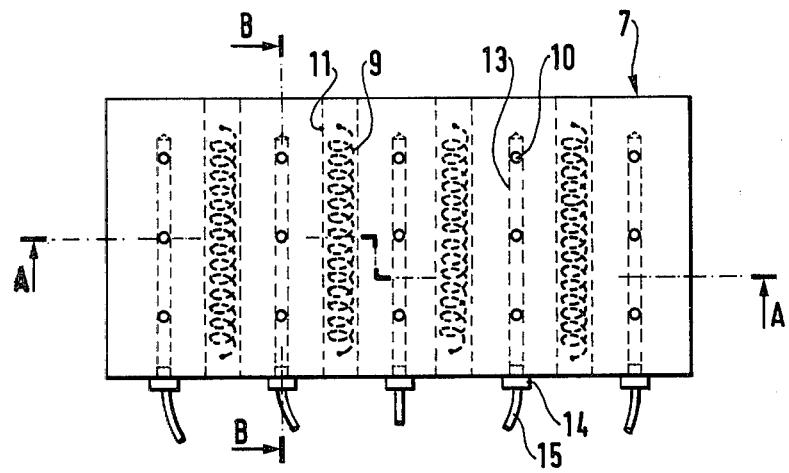
FIG. 2 shows a hot plate provided with ducts in accordance with the invention.
Figure 2A:
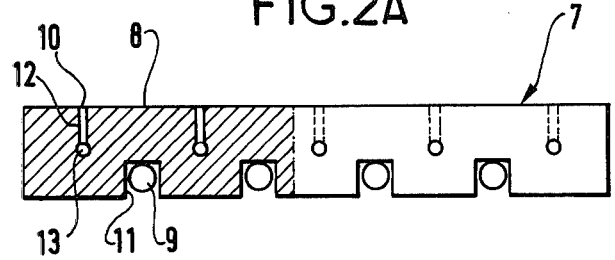
FIGS. 2A and 2B are sections along lines AA and BB of FIG. 2.
Figure 2B:
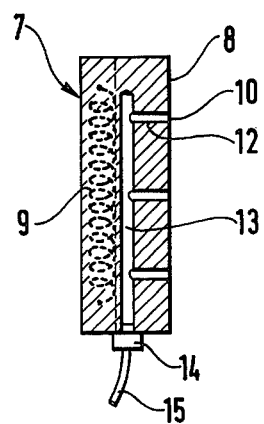

A particular embodiment is shown in FIGS. 2, 2A and 2B.

The hot plate is, for example, 30 cm long and 20 cm wide.

It has grooves such as 11 in which the heater elements 9 are placed.

Ducts 12 run through the plate. They each have one end 10 opening out in the surface 8 of the plate 7. Their other ends are connected to an internal channel 13 which itself opens out at 14 in the side of the plate.

In the example shown, the plate is provided with 15 ducts grouped in threes together with five internal channels.

The outlets 14 of the channels are connected to the vacuum pump 16 (FIG. 1) via flexible tubes 15.

A pump capable of providing a vacuum of 100 mbars with a pumping rate of 50 liters/minute is ample.

The configuratrion described is not limitative. The number of ducts may be reduced or increased, and they may be connected differently to the vacuum pump without going beyond the scope of the invention.

The present invention ensures that the belt, regardless of its internal tensions, remains firmly pressed against the hot plate and takes up a uniform temperature.

The invention is applicable to the manufacture of electronic circuits, in particular hybrid micro-circuits using thin film technology or thick film technology, in which case the "supports" are often referred to as "substrates".

I claim:

1. An installation for assembling electronic components on a support and for soldering the components to the support by re-melting a layer of metal previously deposited on the support, the installation comprising an imperforate endless conveyor belt on which the component-bearing supports are placed, and at least one hot plate having a plane surface over which the belt slides, wherein the improvement comprises a plurality of ducts within the body of the hot plate, each duct having one end opening onto said plane surface, and a vacuum pump connected to the other end of each duct.

2. An installation according to claim 1, further comprising an internal channel interconnecting said plurality of ducts, said internal channel running through the hot plate parallel to said plane surface and opening onto a side face of the plate.

3. An installation according to claim 2 wherein the vacuum pump is connected to the internal channel at said side face of the plate.

4. An installation according to claim 3 wherein the plurality of ducts comprises a row of ducts disposed transversely to the direction of movement of the endless belt and extending generally perpendicularly to the plane surface between said surface and said internal channel.

5. An installation according to claim 4 comprising additional rows of said ducts spaced from and disposed generally parallel to said row of ducts, and a separate internal channel connected to each row of ducts and opening onto said side face of the plate, the vacuum pump being connected to each channel at said side face.

* * * * *